(12) United States Patent
Kurusu

(10) Patent No.: US 7,180,919 B2
(45) Date of Patent: Feb. 20, 2007

(54) LIGHT EMITTING DEVICE DRIVE CIRCUIT

(75) Inventor: Yasuo Kurusu, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 607 days.

(21) Appl. No.: 10/645,627

(22) Filed: Aug. 22, 2003

(65) Prior Publication Data
US 2004/0041758 A1   Mar. 4, 2004

(30) Foreign Application Priority Data
Aug. 23, 2002   (JP)   ............................... 2002-243741

(51) Int. Cl.
*H01S 3/13*   (2006.01)
(52) U.S. Cl. ............................... 372/29.01; 372/29.015
(58) Field of Classification Search .................. 372/18, 372/9, 12, 29.01, 29.014, 50.12
See application file for complete search history.

(56) References Cited

U.S. PATENT DOCUMENTS

| 4,243,951 A | * | 1/1981 | Wolkstein et al. ............ 372/26 |
| 5,907,569 A | * | 5/1999 | Glance et al. ......... 372/29.021 |
| 6,049,175 A | * | 4/2000 | Forsberg .................. 315/200 A |
| 6,388,689 B1 | | 5/2002 | Toda et al. | |

FOREIGN PATENT DOCUMENTS

| JP | 52-144289 | 12/1977 |
| JP | 60-189980 | 9/1985 |
| JP | 07-256902 | 10/1995 |

* cited by examiner

*Primary Examiner*—Minsun Oh Harvey
*Assistant Examiner*—Tuan N. Nguyen
(74) *Attorney, Agent, or Firm*—McDermott Will & Emery LLP

(57) ABSTRACT

The present invention provides a light emitting device drive circuit which does not require complicated feedback control for shortening a rising response delay time in the transition from an extinction state of a light emitting device to a light emitting state so as not to increase a bias current, and for eliminating harmful effects due to the influence of a droop phenomenon. A circuit including a series of a coil 55 and a resistor 54 is connected in parallel with an LD 53. In this configuration, the LD 53 is subjected to supply of an overshoot drive current ILD for a time period determined by a time constant of the coil 55 and the resistor 54, i.e., a time period in which a high-frequency current is supplied in the transition from the extinction state to the light emitting state. Thus, a delay in rise time until light emission of the LD 53 can be decreased. The drive current ILD supplied to the LD 53 is increased in proportion to a decrease of a forward voltage $V_{op}$ supplied to the LD 53 due to temperature rise. Thus, even if the light emitting state continues for a long period of time, the intensity of light emission from the LD 53 can be kept constant.

5 Claims, 11 Drawing Sheets ature rise (FIG. 11).
LIGHT EMITTING DEVICE DRIVE CIRCUIT

BACKGROUND OF THE INVENTION

1. Field of the Invention

The present invention relates to a light emitting device drive circuit, and more particularly to a circuit for driving a light emitting device, such as a laser diode (LD) or a light emitting diode (LED), which emits light.

2. Related Art Statement

As is well known, a light emitting device, such as a laser diode or a light emitting diode, is a semiconductor device which emits light responsive to a drive current supplied by a prescribed drive circuit. The light emitting device is widely used as a light source in the fields of optical communications, printing plate production, etc. In general, the light emitting device has four physical properties as shown below by numbers from 1 to 4 (FIGS. 8 and 9). Due to such physical properties, the light emitting device has problems, such as a response delay between the supply of a drive current and the actual lighting up (FIG. 10), and a droop phenomenon caused by a temperature rise (FIG. 11).

1. The intensity of light emission (a light output $P_o$) is increased in accordance with increase in a driving current (a forward current $I_f$).

2. Temperature rises when a current flows.

3. In the case where the current flow is constant, an operating voltage (a forward voltage $V_{op}$) drops in accordance with the temperature rise, resulting in decrease of the intensity of light emission.

4. The time (a rise time) required for transition from an extinction state to a light emission state is long.

Accordingly, in order to use the light emitting device, various contrivances are adopted for optimizing and stabilizing the intensity of light emission.

For example, in the case of a drive circuit (as illustrated in FIG. 17) for use in an optical communications apparatus for directly modulating the intensity of a laser diode, when the drive circuit applies to the laser diode a prescribed threshold current $I_{th}$ for distinguishing between an extinction state and a light emission state, a bias current IB at a level of $0.9 \times I_{th}$ to $0.95 \times I_{th}$ is constantly supplied. In this manner, the bias current IB is set at as high a level as possible in the extinction state (a contrast ratio is reduced as much as possible), thereby improving the response from extinction to lighting of the laser diode (FIG. 18).

Such a technique for reducing the contrast ratio by the application of a high bias current is effective in the field of optical communications, where it is only required to determine whether the light emitting device is in the light emission state or in the extinction state. However, such a technique causes inconveniences in the field of printing plate production where the laser diode is used as a light source for exposing a photosensitive material. Specifically, the laser set at the bias current exposes portions of the photosensitive material (a printing plate, a prepress film, a direct digital color proofing (DDCP) photosensitive material, etc) which are originally not supposed to be exposed to light, and therefore the higher the bias current becomes (i.e., the contrast ratio becomes smaller), the narrower is the range of a representable image density, resulting in deterioration of prepress quality.

In the field of optical communications, it is hard to imagine the case where the light emission state of the light emitting device lasts continuously for a long period of time, and therefore no specific measures are taken against the droop phenomenon. In the field of printing plate production, however, the light emission state of the light emitting device may last continuously for a long period of time (e.g., a one-line scanning period) depending on types of image data. In such a case, even if a constant current is continuously supplied to the light emitting device, the intensity of light emission varies over time due to the droop phenomenon (FIG. 11), so that the image density becomes uneven, resulting in deterioration of prepress quality.

SUMMARY OF THE INVENTION

Therefore, an object of the present invention is to provide a light emitting device drive circuit which does not require complicated feedback control for shortening a rising response delay time in the transition from an extinction state of a light emitting device to a light emitting state so as not to increase a bias current (so as to reduce the contrast ratio), and for eliminating harmful effects due to the influence of a droop phenomenon.

The present invention has the following features to attain the object mentioned above.

A first aspect of the present invention is directed to a light emitting device drive circuit for driving a light emitting device in accordance with an input signal. The light emitting device drive circuit according to the first aspect includes: a current source for generating constant currents each being supplied to the light emitting device either in a light emitting state or an extinction state in accordance with an input signal; the light emitting device to which a current is supplied by the current source; and a resistor connected in parallel with the light emitting device. The light emitting device emits light and quenches light emission in accordance with a drive current which is a subtraction of a current supplied to the resistor from the current supplied by the current source.

In the light emitting device drive circuit according to the first aspect, it is preferred to set a value of the resistor so as to increase the drive current supplied to the light emitting device when a forward voltage of the light emitting device is decreased in connection with a temperature rise due to light emission, and the drive current is increased by an amount of a current for compensating for an intensity of the light from the light emitting device which is decreased due to the decrease of the forward voltage.

Thus, in the first aspect, a simply configured light emitting device drive circuit including a resistor connected in parallel with a light emitting device can eliminate harmful effects due to the influence of the droop phenomenon.

A second aspect of the present invention is directed to a light emitting device drive circuit for driving a light emitting device in accordance with an input signal. The light emitting device drive circuit according to the second aspect includes: a current source for generating constant currents each being supplied to the light emitting device either in a light emitting state or an extinction state in accordance with an input signal; the light emitting device to which a current is supplied by the current source; a coil connected at one end to an anode of the light emitting device; and a resistor connected between the other end of the coil and a cathode of the light emitting device. The light emitting device emits light and quenches light emission in accordance with a drive current which is a subtraction of a current supplied to the coil and the resistor from the current supplied by the current source.

In the light emitting device drive circuit according to the second aspect, it is preferred to set values of the coil and the resistor so as to increase the drive current applied across the light emitting device during a rising response delay period in a transition from an extinction state of the light emitting device to a light emitting state, and the drive current is increased by an amount for shortening the rising response delay period.

Further, in the light emitting device drive circuit according to the second aspect, it is preferred to set the values of the coil and the resistor so as to increase the drive current supplied to the light emitting device when a forward voltage of the light emitting device is decreased in connection with a temperature rise due to light emission, and the drive current is increased by an amount of a current for compensating for an intensity of the light from the light emitting device which is decreased due to the decrease of the forward voltage.

Thus, in the second aspect, a simply configured light emitting device drive circuit including a series circuit including the coil and the resistor which is connected in parallel with the light emitting device can shorten the rising response delay period in the transition from the extinction state of the light emitting device to the light emitting state so as not to increase a bias current (so as to reduce the contrast ratio) and can also eliminate harmful effects due to the influence of the droop phenomenon.

The circuit including a series of the coil and the resistor, which is connected in parallel with the light emitting device, maybe connected in the order opposite to that of the second aspect. The same effect can be achieved even when the coil and the resistor are connected in the opposite order.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, a light emitting device drive circuit of the present invention will be described with respect to an exemplary case where the light emitting device drive circuit is used in a printing plate producing apparatus (of a drum scanner type or a flatbed scanner type) including a laser diode as a light source.

First, a general description of the printing plate producing apparatus using a light emitting device drive circuit is given.

Figure 1:
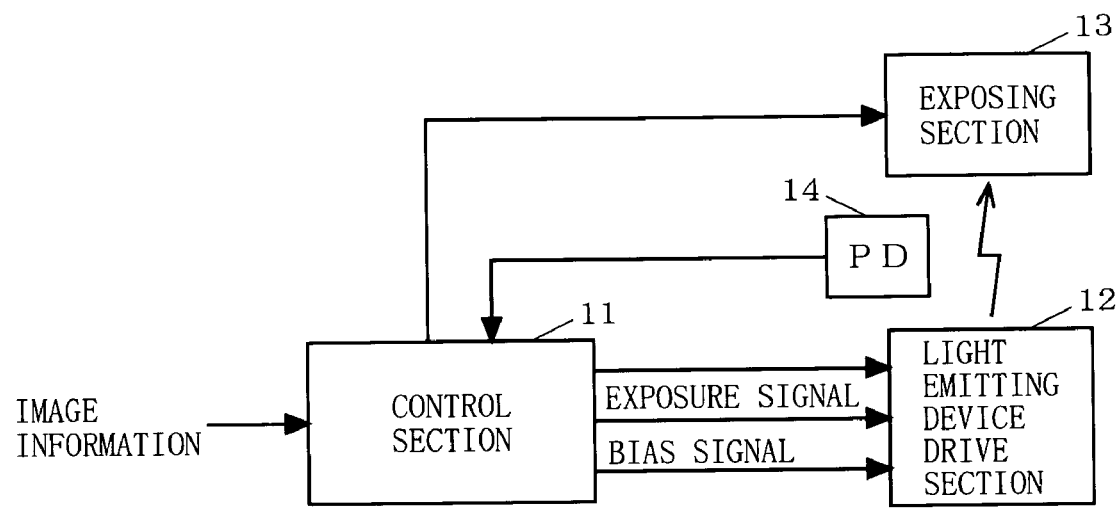
FIG. 1 is a block diagram illustrating a configuration of a printing plate producing apparatus using a light emitting device drive circuit according to an embodiment of the present invention.

FIG. 1 is a block diagram illustrating a configuration of a printing plate producing apparatus using a light emitting device drive circuit according to an embodiment of the present invention. In FIG. 1, the printing plate producing apparatus includes: a control section 11 which plays a role of controlling the entire apparatus; a light emitting device drive section 12 which is an optical head including a laser diode; an exposing section 13 including a photosensitive material; and a photodiode (PD) 14 for receiving light from the laser diode. The light emitting device drive circuit of the present invention is included in the light emitting drive section 12.

The control section 11 controls the light emitting device drive section 12 and the exposing section 13 such that a photosensitive material placed in the exposing section 13 is scanned by a laser beam output by the light emitting device drive section 12 along both a primary scanning direction and a secondary scanning direction (a direction vertical to the primary scanning direction).

Figure 2:
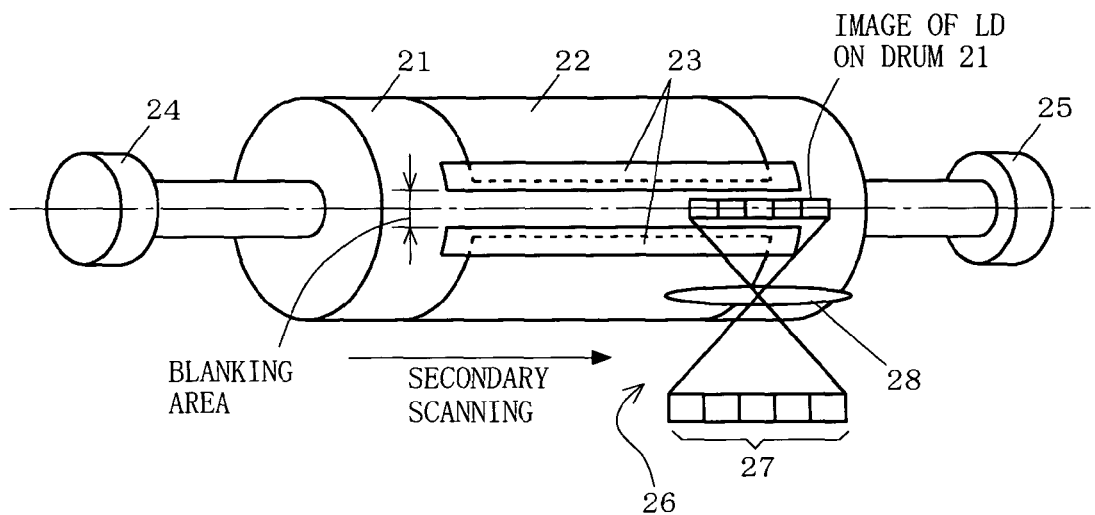
FIG. 2 is a diagram illustrating an exemplary configuration including an exposing section 13 and a light emitting device drive section 12 which are shown in FIG. 1.

The exposing section 13 is provided in the form of, for example, a drum scanner structure and a flatbed setter structure. As illustrated in FIG. 2, the drum scanner structure uses a drum 21 to be rotated by a primary motor 25, and a photosensitive material 22 wrapped around the circumference of the drum 21 is rotated along the primary scanning direction, while an optical head 26, which corresponds to the light emitting drive section 12, is moved along the secondary scanning direction, so that an image is exposed on the photosensitive material 22. The optical head 26 includes a laser diode (LD) 27, and a lens 28 for focusing a laser beam output by the laser diode 27 onto the photosensitive material 22.

Figure 3:
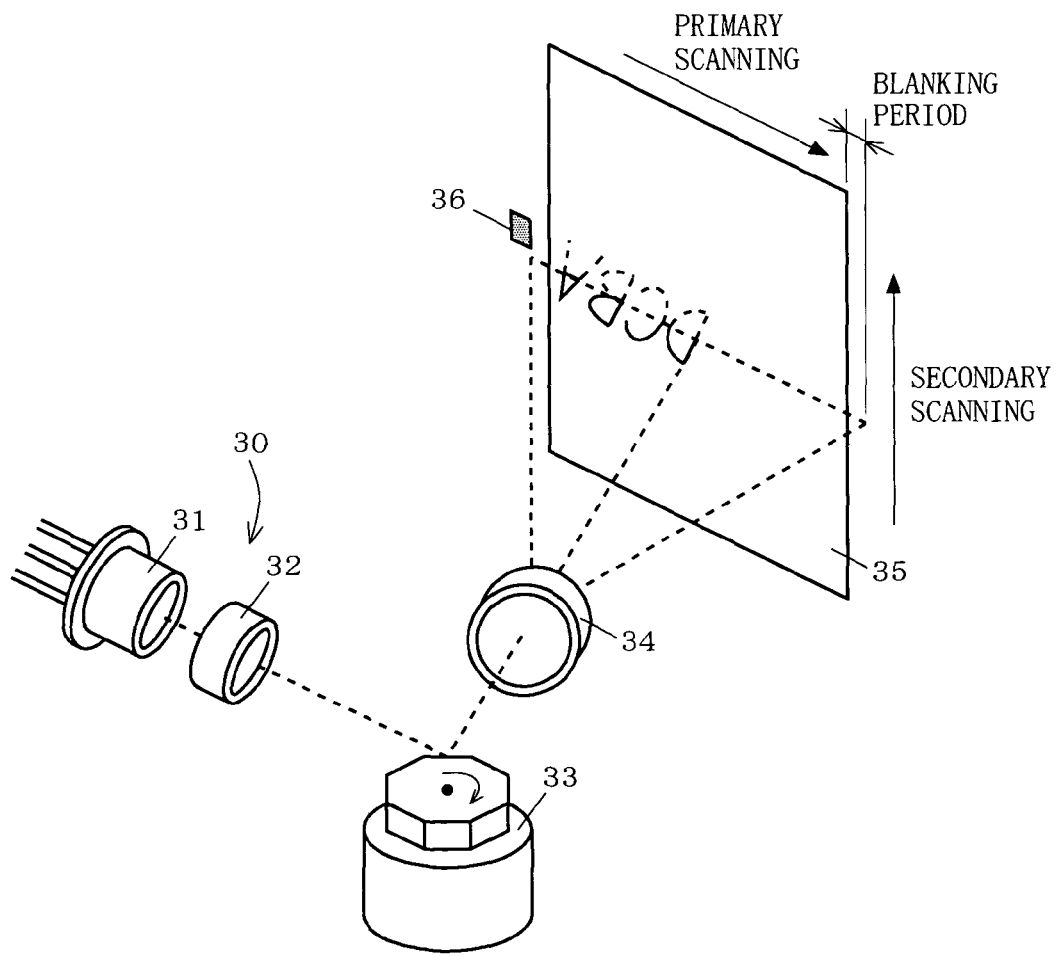
FIG. 3 is a diagram illustrating another exemplary configuration including the exposing section 13 and the light emitting device drive section 12 which are shown in FIG. 1.

FIG. 3 is a schematic diagram of a printing plate producing apparatus of a flatbed scanner type. As illustrated in FIG. 3, in the flatbed setter structure, an optical head 30, which corresponds to the light emitting device drive section 12, includes a laser diode 31, a collimator lens 32, a polygon mirror 33, and an f-θ lens 34. A laser beam emitted by the laser diode 31 is converted into a parallel laser beam by the collimator lens 32, and the parallel laser beam is deflected by rotation of the polygon mirror 33 so as to pass through the f-θ lens 34 and scan a photosensitive material 35 along the primary scanning direction, resulting in an image formed on the photosensitive material 35. Note that the photosensitive material 35 is then transferred in the secondary scanning direction by a secondary scanning means (not shown).

The polygon mirror 33 rotates at a constant speed. Owing to the f-θ characteristic of the f-θ lens 34, the laser beam propagating from the laser diode 31 (through the collimator lens 32 and the f-θ lens 34) scans a photosensitive material at a constant speed. A start sensor 36 is placed in the vicinity of the photosensitive material 35 in order to detect a primary scanning start location. The start sensor 36 detects the primary scanning start location from which the laser beam deflected by the polygon mirror 33 starts primary scanning along the primary scanning direction. Then, the aforementioned secondary scanning means (not shown) transfers the photosensitive material 35 in the secondary scanning direction in synchronization with timing of the primary scanning by the laser beam detected by the start sensor 36.

In accordance with a signal from an encoder 24 (FIG. 2) in the drum scanner structure or a signal from the start sensor 36 in the flatbed setter structure, the control section 11 performs the control of timing at which the laser diode 27 or 31 emits light, as well as the control of allowing the laser beam to scan along the primary scanning direction (i.e., the control of rotation of the primary motor 25 or the polygon mirror 33). Further, in synchronization with the timing of the primary scanning by the laser beam in accordance with the rotation of the drum 21 or the polygon mirror 33 in the exposing section 13, the control section 11 relatively displaces the light emitting device drive section 12 (the optical head 26 or 30) along the secondary scanning direction with respect to the photosensitive material 22 or 35 held in the exposing section 13.

The control section 11 receives image information (resolution, a data size, an image exposing location, positive/negative of the photosensitive material 22 or 35, image data, etc.) from an external computer or the like. In accordance with the image information, the control section 11 generates an exposure signal and a bias signal for driving the laser diode 27 or 31, and then transmits the generated signals to the light emitting device drive section 12. Based on a result of observation of the intensity of the laser diode 27 or 31 which is performed using the photodiode 14, an auto power control (APC) operation is performed so that the exposure signal and the bias signal are always controlled to keep their respective prescribed values. The APC operation is performed using a blanking area where no photosensitive material is present. In the drum scanner structure, the blanking area is located between a pair of clumps 23 for holding the photosensitive material 22 on the drum 21. The APC operation is performed during a time period in which the light emitting device drive section 12 passes across the blanking area. In the flatbed setter structure, the blanking area, where the APC operation is performed, is located outside a periphery of the photosensitive material 35.

The light emitting device drive section 12 generates an exposure current and a bias current in accordance with the exposure signal and the bias signal which are transmitted from the control section 11. Then, the light emitting device drive section 12 performs a light exposure process on the photosensitive material 22 or 35 placed in the exposing section 13 by supplying the exposure current and the bias current to the laser diode 27 or 31 so as to emit light and then quench the light emission.

Hereinbelow, a configuration of a light emitting device drive circuit included in the light emitting device drive section 12 will be described for each problem to be solved.

(First Embodiment)

Figure 4:
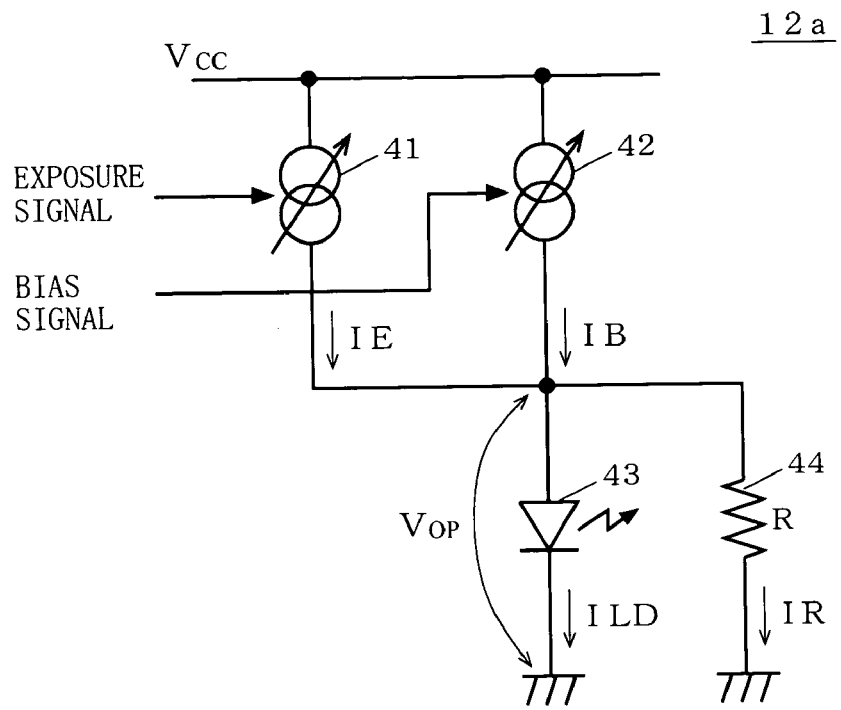
FIG. 4 is a circuit diagram illustrating a configuration of a light emitting device drive circuit 12a according to a first embodiment of the present invention.

FIG. 4 illustrates a configuration of a light emitting device drive circuit 12a according to a first embodiment of the present invention. The light emitting device drive circuit 12a is adapted for eliminating harmful effects due to the influence of the droop phenomenon.

In FIG. 4, the light emitting device drive circuit 12a includes variable current sources 41 and 42, a laser diode 43, and a resistor 44. The variable current sources 41 and 42 are connected to a power source $V_{cc}$ at one end and are mutually connected at the other ends. In accordance with an exposure signal transmitted from the control section 11, the variable current source 41 functions as a constant current source for controlling amperage so as to be kept constant and supplying an exposure current to the laser diode 43 in a light emitting state. In accordance with a bias signal transmitted from the control section 11, the variable current source 42 functions as a constant current source for controlling amperage so as to be kept constant and supplying a bias current to the laser diode 43 in an extinction state. An anode of the laser diode 43 is connected to the mutually-connected other ends of the variable current sources 41 and 42, and a cathode of the laser diode 43 is grounded. The resistor 44 is connected in parallel with the laser diode 43.

Figure 8:
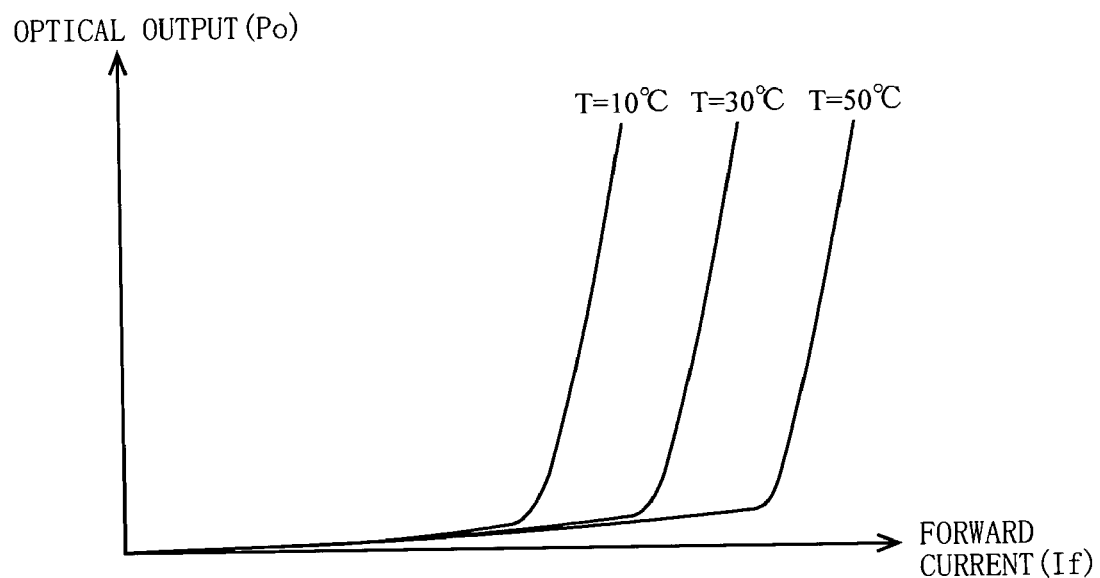
FIG. 8 is a graph showing an example of a forward current-optical output characteristic of a light emitting device.
Figure 9:
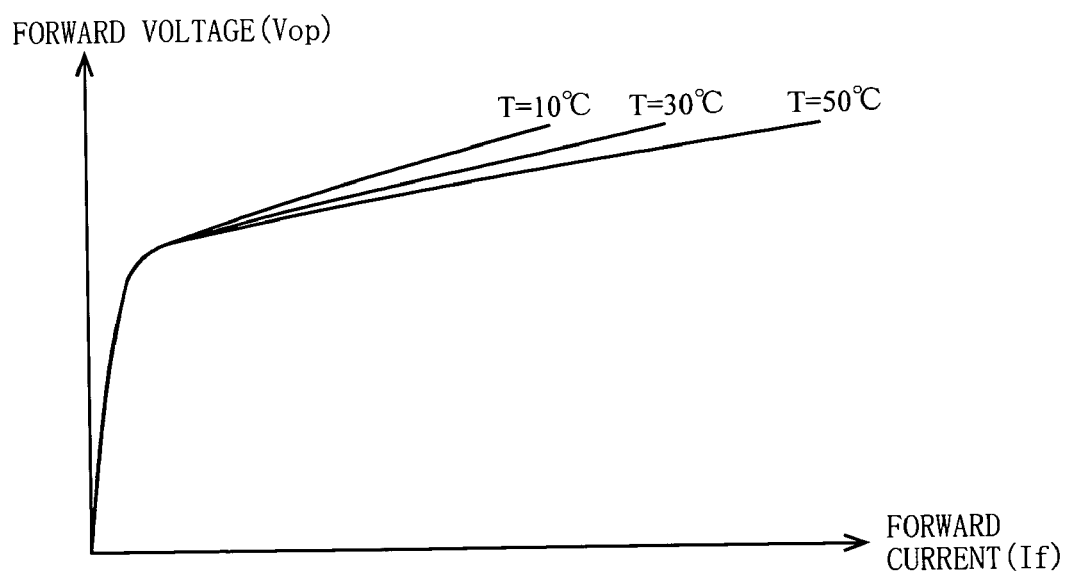
FIG. 9 is a graph showing an example of a forward current-forward voltage characteristic of a light emitting device.

In general, a light emitting device, such as a laser diode or an LED, has a property as shown in FIG. 8. Specifically, optical output $P_o$ of the light emitting device is increased as a forward current $I_f$ supplied to the light emitting device is increased. A current value at which the optical output $P_o$ is obtained varies depending on temperature of the light emitting device itself. The light emitting device also has a property such that the temperature thereof rises when being driven continuously (no graphs are provided for reference). Further, as shown in FIG. 9, in the case where the temperature of the light emitting device rises while a constant forward current $I_f$ is supplied thereto, an operating voltage (a forward voltage $V_{op}$) of the light emitting device is decreased.

Hereinbelow, an operation of the light emitting device drive section 12a having the above-described configuration will be described in detail.

Based on an exposure current IE supplied by the variable current source 41, a bias current IB supplied by the variable current source 42, a forward voltage $V_{op}$ of the laser diode 43, and a resistance value R of the resistor 44, a current IR supplied to the resistor 44 and a drive current ILD supplied to the laser diode 43 are obtained as follows:

$$IR = V_{op}/R,$$

$$ILD = IE + IB - IR = IE + IB - (V_{op}/R).$$

Figure 11:
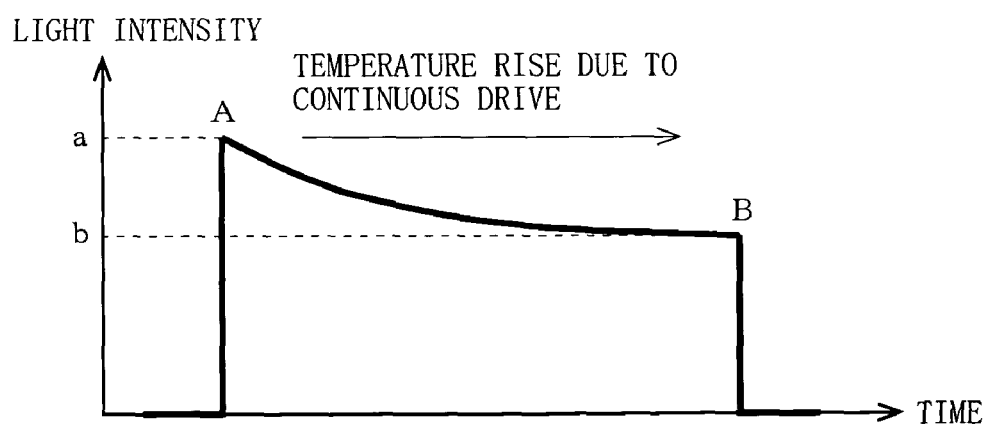
FIG. 11 is a graph for explaining a droop phenomenon caused due to a physical property of a light emitting device.

Here, it is assumed that the droop phenomenon as shown in FIG. 11 is caused. In the laser diode 43, its temperature gradually rises from point A at which the supply of the drive current ILD is started, and the forward voltage $V_{op}$ is decreased in connection with the temperature rise. In the case of a conventional circuit (a circuit without the resistor 44 illustrated in FIG. 4), a constant current is supplied to the laser diode 43 (i.e., ILD=IE+IB), and therefore the intensity of light emission is decreased because of the temperature rise accompanied by decrease of the forward voltage $V_{op}$. On the other hand, in the light emitting device drive circuit 12a according to the present embodiment, the current IR supplied to the resistor 44 is decreased in proportion to the decrease of the forward voltage $V_{op}$ caused in connection with the temperature rise. That is, the drive current ILD supplied to the laser diode 43 is increased by the amount equivalent to the decrease of the current IR.

In this manner, in the light emitting device drive circuit 12a, the drive current ILD is increased so as to cancel the influence resulted from the decrease of the forward voltage $V_{op}$, and therefore the intensity of light emission from the laser diode 43 can be kept constant.

For example, the resistance value R of the resistor 44 can be simply obtained in the following manner. Firstly, in the conventional circuit without the resistor 44, the laser diode 43 is continuously lit up at a usual working temperature for a time period corresponding to a single primary scanning time period, and the droop phenomenon of the laser diode 43 is observed. That is, the observation is conducted to see how much the intensity of light emission is decreased while the laser diode 43 emits light for a single primary scanning time period. In the graph shown in FIG. 11, assuming that "a" indicates the intensity of light emission from the laser diode 43 at a light emission start point and "b" indicates the intensity of light emission from the laser diode 43 after a time period corresponding to the single primary scanning time period, a difference (a–b) corresponds to the decreased intensity of light emission. In the following description, a time point at which the laser diode 43 starts to emit light is referred to as the "point A", and a time point after the laser diode 43 has emitted light for the single primary scanning time period is referred to as the "point B".

Next, how a forward voltage varies between the points A and B is measured. That is, a difference $(V_a - V_b)$ between a forward voltage $V_a$ at the point A and a forward voltage Vb at the point B is measured.

Figure 12:
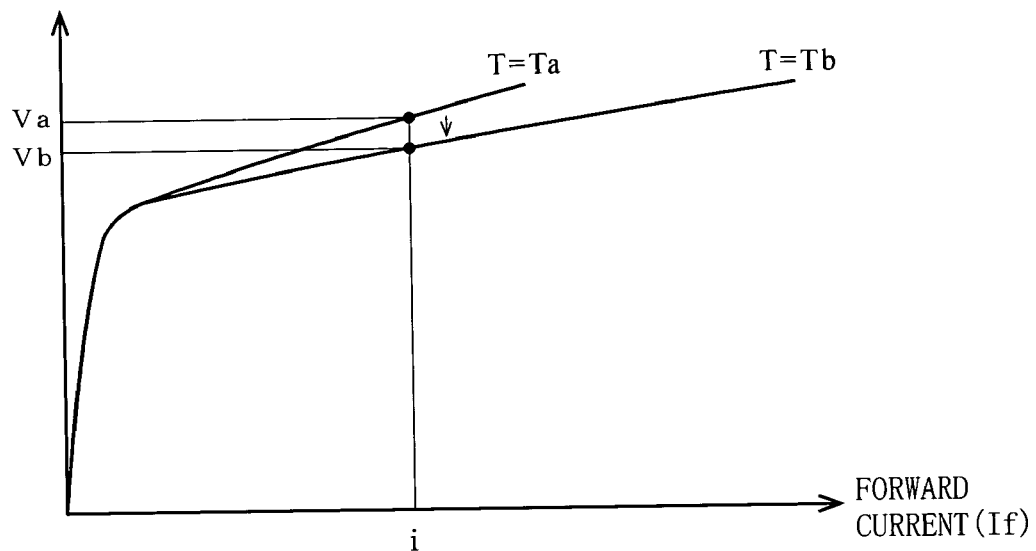
FIG. 12 is a graph showing an example of a forward current-forward voltage characteristic of a light emitting device.

Further, how the temperature of a light emitting point of the laser diode 43 varies between the points A and B is calculated by supplying a given forward current i and the above-measured forward voltages $V_a$ and $V_b$ to the forward current-forward voltage characteristic graph shown in FIG. 12. Thus, temperatures $T_a$ and $T_b$ at the points A and B of the light emission point of the laser diode 43 are obtained.

Figure 13:
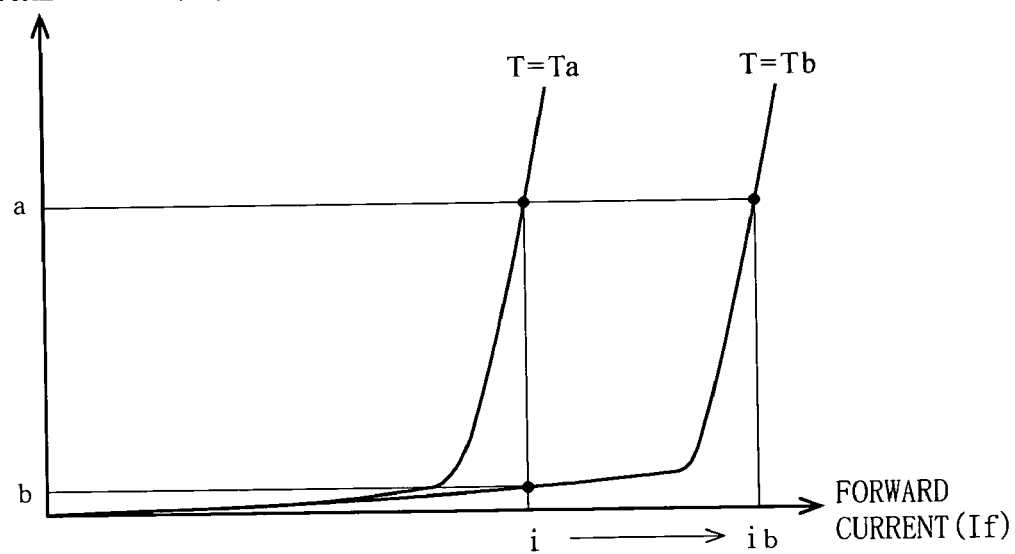
FIG. 13 is a graph showing an example of a forward current-optical output characteristic of a light emitting device.

On the other hand, the amount of an additional current required for maintaining a desired intensity is calculated by applying the temperature $T_b$ of the laser diode 43 after light emission and the given forward current i to the forward current-optical output characteristic graph shown in FIG. 13. That is, a forward current $i_b$ required for obtaining a desired optical output a at the temperature $T_b$ of the point B is calculated, and then a difference $(i_b - i)$ between the forward current $i_b$ and the given forward current i is calculated.

In this manner, variations of the forward voltage and the forward current are obtained with respect to the laser diode 43 before and after light emission. The obtained variations are used for calculating the resistance value R of the resistor 44 as follows:

$R = (V_b - V_a)/(i_b - i)$.

Note that the sum of the bias current IB supplied by the various current source 42 and the exposure current IE supplied by the various current source 41 is required to be increased by the amount of $V_d/R$ as compared to the sum of the bias current and the exposure current in the case where no resistor 44 is provided. A method for controlling a value of a current supplied to a laser diode and timing of such control are described in detail in the following second embodiment.

(Second Embodiment)

Figure 5:
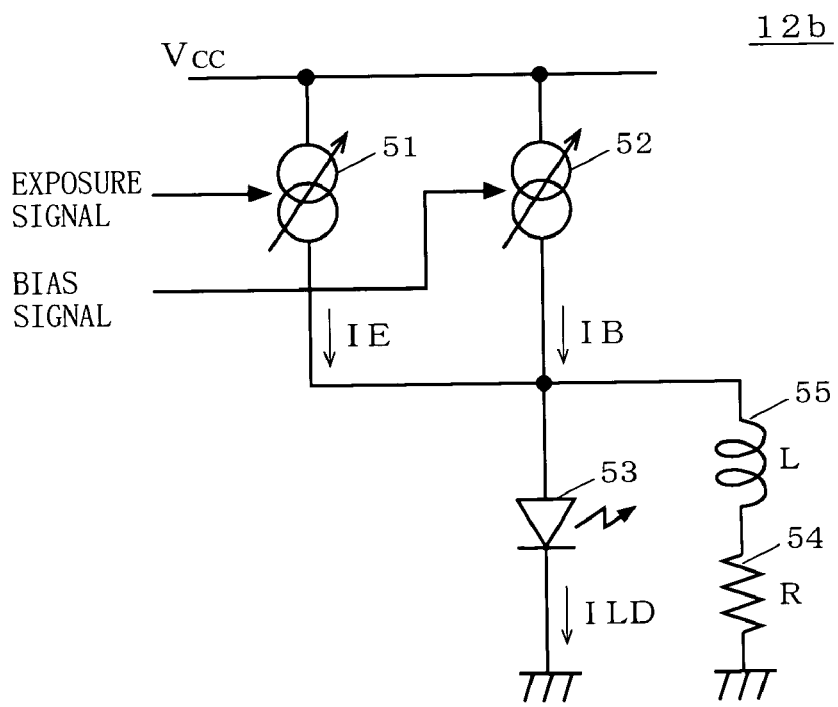
FIG. 5 is a circuit diagram illustrating a configuration of a light emitting device drive circuit 12b according to a second embodiment of the present invention.

FIG. 5 illustrates a configuration of a light emitting device drive circuit 12b according to a second embodiment of the present invention. The light emitting device drive circuit 12b is adapted for shortening a rising response delay time in the transition from an extinction state of the laser diode 43 to a light emitting state. Note that the light emitting device drive circuit 12b has the effect of eliminating harmful effects due to the influence of the above-described droop phenomenon.

Figure 14:
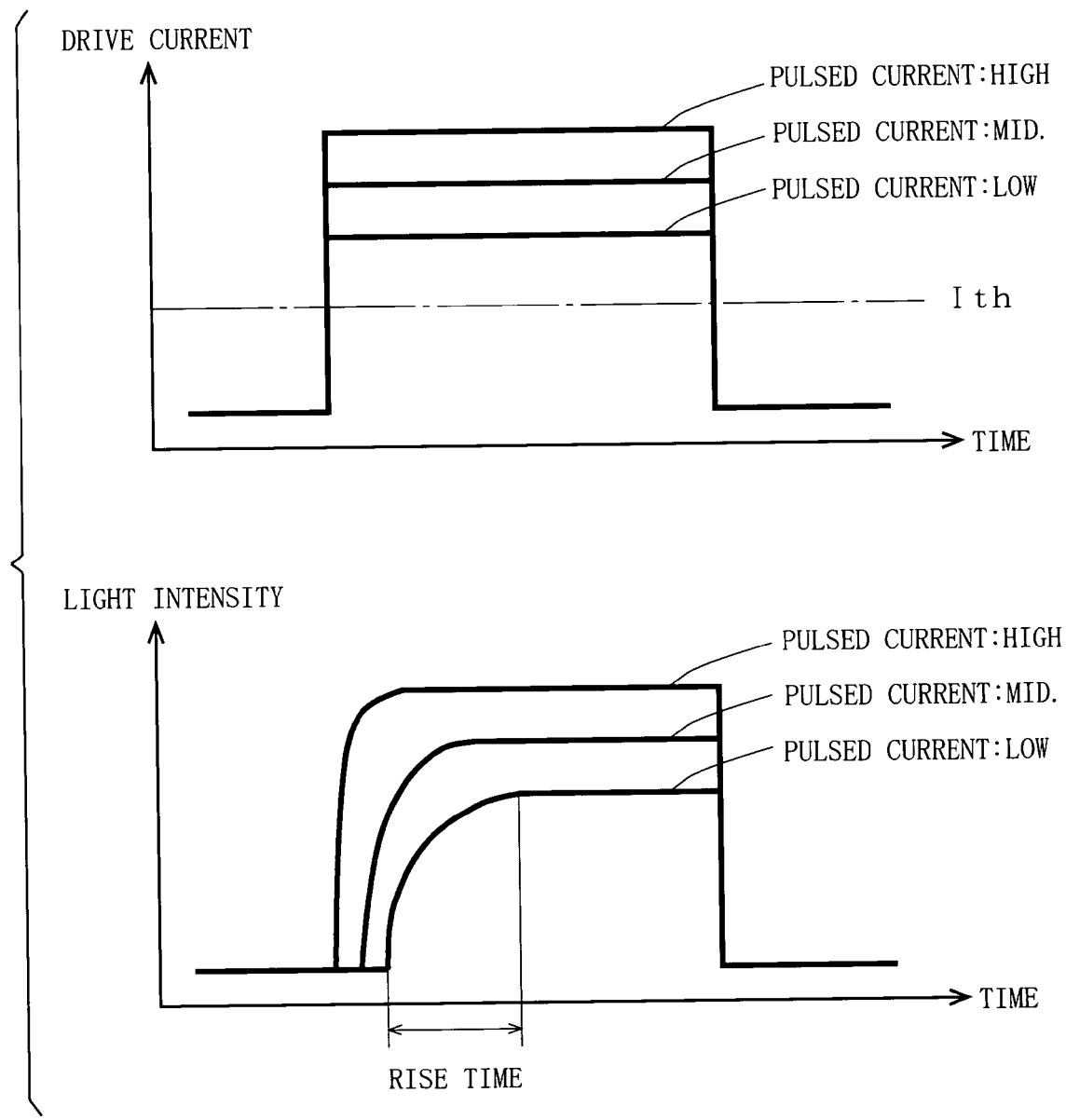
FIG. 14 illustrates graphs for explaining a general characteristic of a laser diode.

In general, the light emission response of a laser diode is unsatisfactory unless a current is injected to a threshold current level (i.e., it takes long time for a transition from an extinction state to a state where the laser diode is lit up). That is, in the case where a pulsed current, which rises instantly, is suddenly supplied to the laser diode while supplying a bias current lower than the threshold current level, a time delay is caused before a laser beam is emitted. Further, the laser diode is characterized in that the higher the value of the pulsed current becomes, the shorter is a time period required for emitting a laser beam (see FIG. 14).

In FIG. 5, the light emitting device drive circuit 12b includes variable current sources 51 and 52, a laser diode 53, a coil 55, and a resistor 54. The variable current sources 51 and 52 are connected to a power source $V_{cc}$ at one end and are mutually connected at the other ends. In accordance with an exposure signal transmitted from the control section 11, the variable current source 51 functions as a constant current source for controlling amperage so as to be kept constant and supplying an exposure current to the laser diode 53 in a light emitting state. In accordance with a bias signal transmitted from the control section 11, the variable current source 52 functions as a constant current source for controlling amperage so as to be kept constant and supplying a bias current to the laser diode 53 in an extinction state. An anode of the laser diode 53 is connected to the mutually-connected other ends of the variable current sources 51 and 52, and a cathode of the laser diode 53 is grounded. The coil 55 is connected at one end to the anode of the laser diode 53 and at the other end to one end of the resistor 54. The other end of the resistor 54 is connected to the cathode of the laser diode 53, i.e., the resistor 54 is grounded at the other end.

Hereinbelow, an operation of the light emitting device drive section 12b having the above-described configuration will be described in detail.

Figure 10:
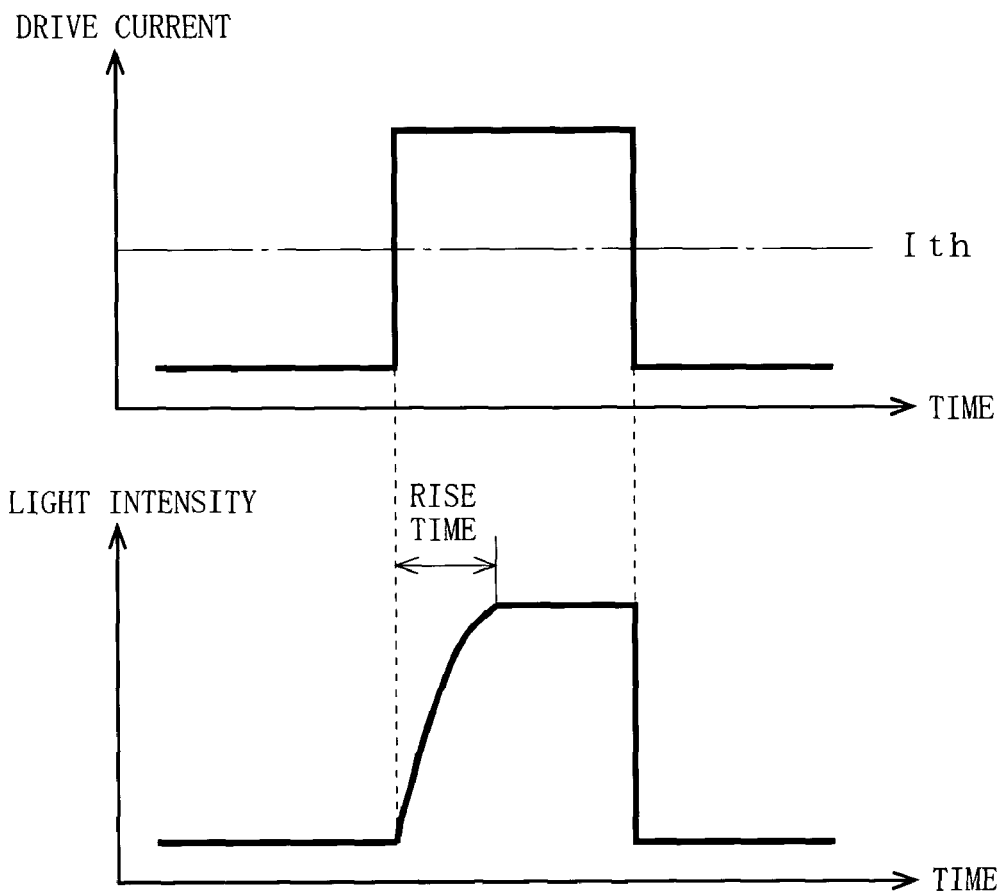
FIG. 10 illustrates graphs for explaining a response delay caused due to a physical property of a light emitting device.

Here, it is assumed that a delay in rise time as shown in FIG. 10 is caused in the laser diode 53. In this case, a drive current ILD supplied to the laser diode 53 is required to be temporally increased for a time period corresponding to the delay in rise time. Accordingly, in the light emitting device drive circuit 12b according to the present embodiment, a series configuration of the coil 55 and the resistor 54 is provided in parallel with the laser diode 53 such that an overcurrent (a current having a value higher than a desired current value calculated based on the forward current-optical output characteristic graph shown in FIG. 8) is supplied to the laser diode 53 for a time period in which a high-frequency current is supplied in the transition from an extinction state to a light emitting state.

Figure 6:
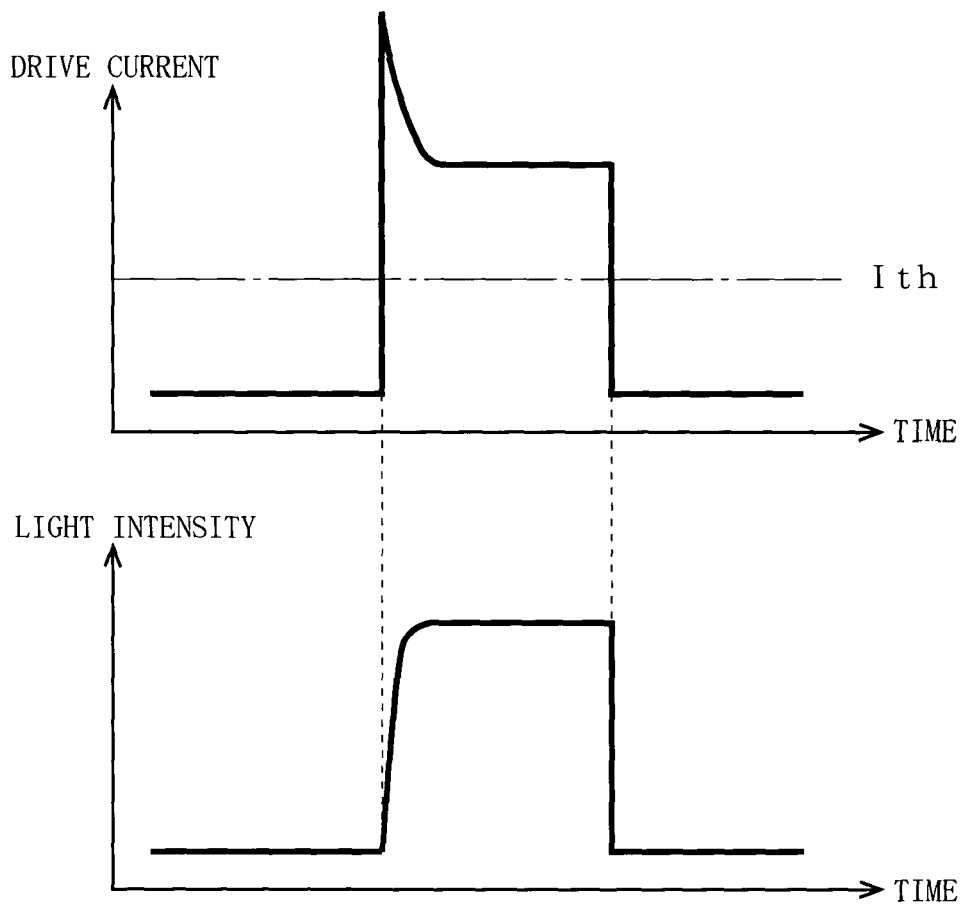
FIG. 6 illustrates graphs for explaining a drive current ILD supplied to a laser diode 53 included in the light emitting device drive circuit 12b illustrated in FIG. 5.

In the-thus configured light emitting device drive section 12b, the coil 55 has a characteristic such that a high-frequency current is hard to flow therethrough, and therefore an overshoot drive current ILD as shown in FIG. 6 is supplied to the laser diode 53 in accordance with Kirchhoff's law. Thus, it is possible to reduce the delay in rise time of the laser diode 53 as shown in FIG. 10 in the conventional circuit.

A method for setting actual values of currents supplied to a laser diode (values of the bias current IB and the exposure current IE) is now described with reference to FIG. 15 by taking as an example the flatbed scanning previously described in conjunction with FIG. 3.

Figure 15:
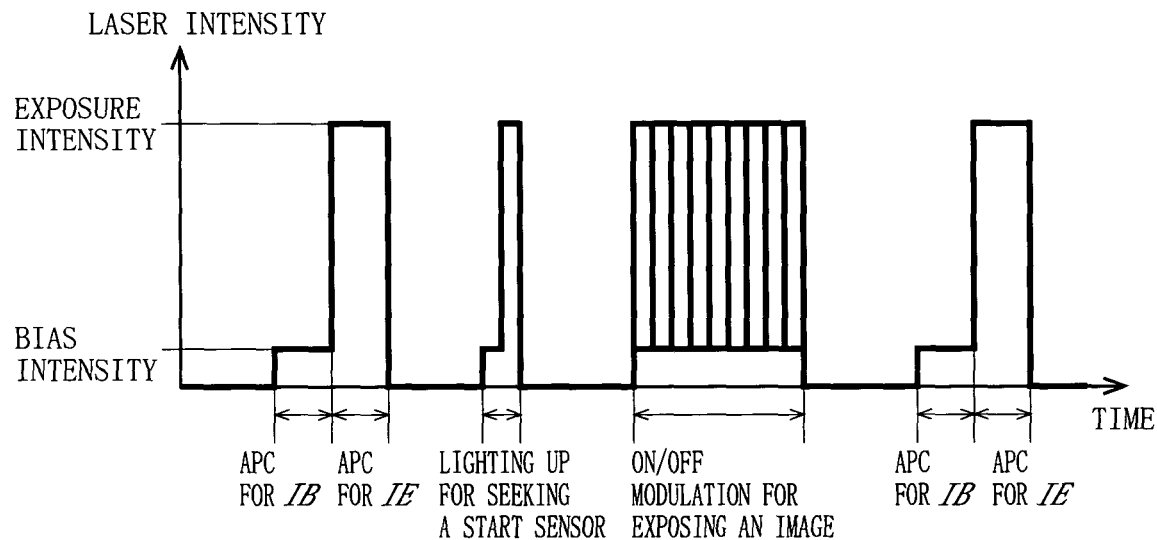
FIG. 15 is a graph for explaining variations over time in the intensity of a laser beam in a flatbed scanning apparatus shown in FIG. 3.

FIG. 15 shows variations over time in the intensity of a laser beam output by the laser diode 31 in the flatbed scanning previously described in conjunction with FIG. 3. The value of the bias current IB is set by performing an APC operation such that the bias intensity of the laser beam output by the laser diode 31 reaches a prescribed level (e.g., a level at which the photosensitive material 35 is not exposed) in a time period indicated by the "APC for IB" in FIG. 15. The value of the exposure current IE is set by performing an APC operation such that the exposure intensity of the laser beam output by the laser diode 31 reaches a prescribed level (e.g., a level at which the photosensitive material 35 can be exposed) in a time period indicated by the "APC for IE" in FIG. 15. In this manner, the values of the bias current IB and the exposure current IE are set by individual APC operations. This processing is also performed in the above-described first embodiment (where no coil 55 is provided).

Note that a current supplied to the light emitting device drive circuit 12b illustrated in FIG. 5 is supplied not only to the laser diode 53 but also to the coil 55 and the resistor 54, and therefore it is necessary to perform the above-described APC operations so as to set the values of the bias current IB and the exposure current IE, such that a large amount of current flows through the light emitting device drive circuit 12b as compared to the case where neither the coil 55 nor the resistor 54 is provided in the light emitting device drive circuit 12b. Specifically, each of the values of the bias current IB and the exposure current IE is set so as to be greater by $V_{op}/R$ (a value of current supplied to the coil 55 and the resistor 54) as compared to the case where neither the coil 55 nor the resistor 54 is provided in the light emitting device drive circuit 12b.

Figure 7:
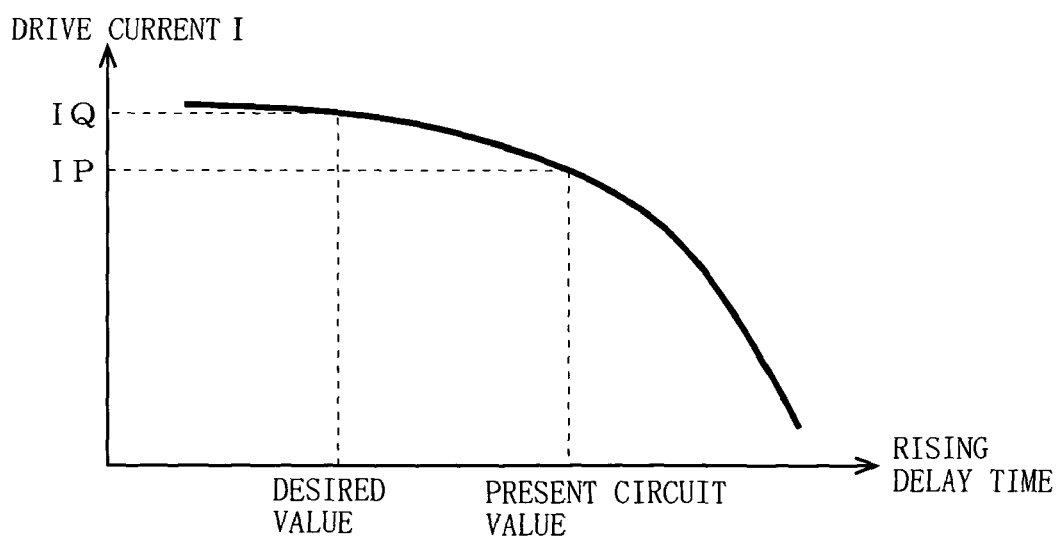
FIG. 7 is a graph showing an example of a drive current-rising response delay time characteristic used for setting values of a coil 55 and a resistor 54 which are included in the light emitting device drive circuit 12b illustrated in FIG. 5.

For example, a reactance L of the coil 55 can be simply obtained in the following manner. Firstly, arising response delay time characteristic of various drive currents as shown in FIG. 7 is obtained with respect to the case where neither the coil 55 nor the resistor 54 is provided. Then, a drive current IQ, which corresponds to a desired rising response delay time, is derived using the obtained characteristic, and then a differential current (IQ-IP) from a drive current IP for the present circuit without the coil 55 and the resistor 54 is calculated. The differential current (IQ-IP) corresponds to an overshoot current value to be added to the drive current IP. Lastly, a time constant of the coil 55 and the resistor 54 is set so as to optimize the duration of the overshoot.

Note that in the case where the resistance R of the resistor 54 is previously determined in order to eliminate the influence of the above-described droop phenomenon, the reactance L of the coil 55 can be readily determined. In such a case, it is necessary to increase the exposure current IE supplied by the various current source 51 by a value of the differential current (IQ-IP) as compared to the exposure current supplied in the case where neither the coil 55 nor the resistor 54 is provided.

Figure 16:
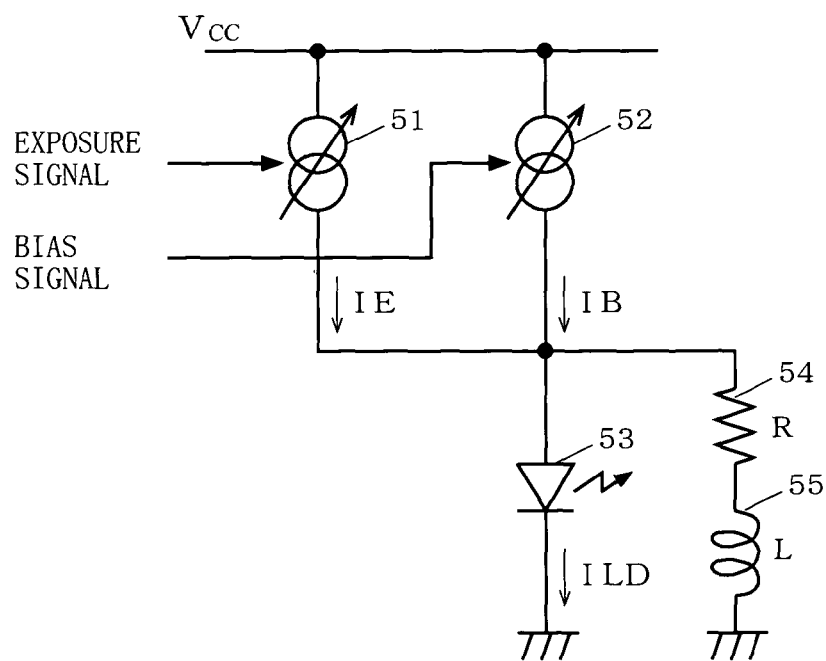
FIG. 16 is a circuit diagram illustrating principal parts of a variant of the light emitting device drive circuit 12b according to the second embodiment of the present invention.
Figure 17:
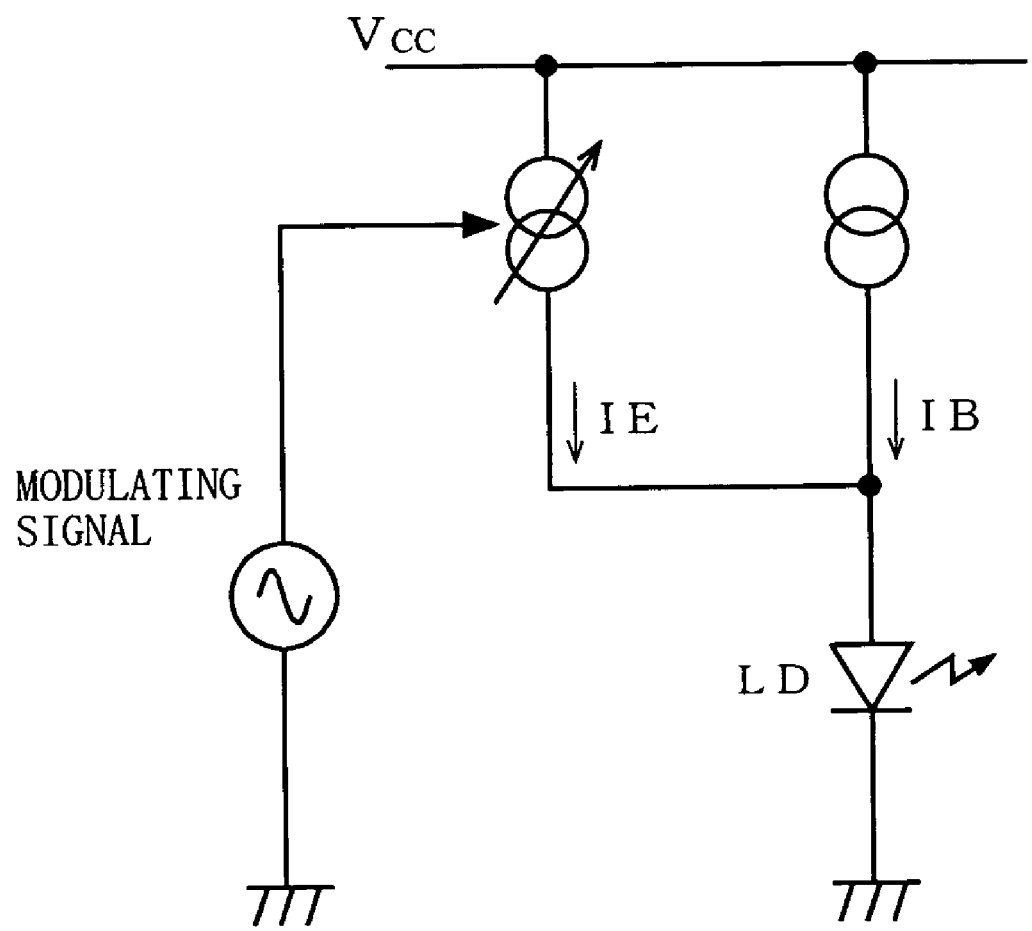
FIG. 17 is a circuit diagram illustrating an exemplary configuration of a conventional light emitting device drive circuit.
Figure 18:
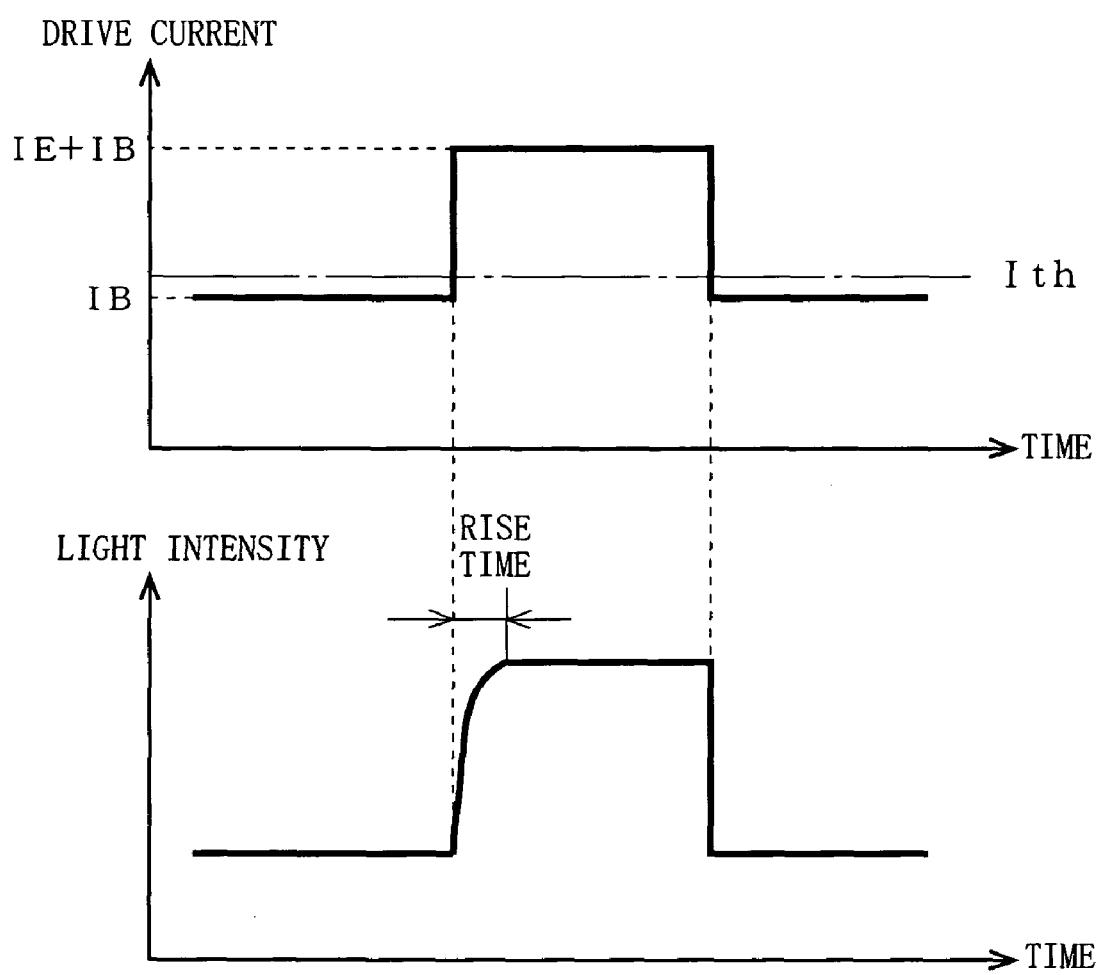
FIG. 18 illustrates graphs for explaining how a response delay is improved by the conventional light emitting device drive circuit described in conjunction with FIG. 17.

In the second embodiment, although the coil 55 is connected to the anode of the laser diode 53 and the resistor 54 is connected to the cathode of the laser diode 53, the same effect can be achieved even if the order of connecting the coil 55 and the resistor 54 is changed as illustrated in FIG. 16.

As described above, a simply configured light emitting device drive circuit according to each of the first and second embodiments of the present invention can eliminate harmful effects due to the influence of the droop phenomenon, and can also shorten a rising response delay time in the transition from an extinction state of a light emitting device to a light emitting state so as not to increase a bias current (so as to reduce the contrast ratio).

Although the above-described embodiments have been described with respect to the light emitting device drive circuits 12a and 12b in which a bias current is constantly supplied by a variable current source 42 or 52, the effect of the present invention is not changed even if the bias current is not supplied.

While the invention has been described in detail, the foregoing description is in all aspects illustrative and not restrictive. It is understood that numerous other modifications and variations can be devised without departing from the scope of the invention.

What is claimed is:

1. A light emitting device drive circuit for a printing plate producing apparatus which has a light emitting device for emitting a laser beam for scanning a photosensitive material placed in an exposing section along both a primary scanning direction and a secondary scanning direction and exposing an image on a photosensitive material, controls an intensity of light when the light emitting device starts a primary scanning to keep a predetermined value, and drives the light emitting device in accordance with an input signal, the light emitting device drive circuit comprising:

a light receiving device for receiving the laser beam emitted from the light emitting device;

a control section for performing an auto power control based on an intensity of light received by the light receiving device, and for generating the input signal using a blanking area where the light emitting device does not perform the primary scanning, so that the intensity of light when the light emitting device starts the primary scanning is the predetermined value;

a current source for generating constant currents, each being supplied to the light emitting device either in a light emitting state or an extinction state in accordance with the input signal;

the light emitting device to which a current is supplied by the current source; and a resistor connected in parallel with the light emitting device, wherein the light emitting device emits light and quenches light emission in accordance with a drive current which is a subtraction of a current supplied to the resistor from the current supplied by the current source, and the resistance value R of the resistor is obtained using an equation:

$$R=(Va-Vb)/(ib-i)$$

where (ib-i) represents an amount of change of current supplied to the light emitting device, wherein the amount of change of current supplied to the light emitting device is required for keeping the intensity of light output by the light emitting device constant with a temperature change of the light emitting device caused by a light emitted therefrom in a single primary scanning time period with the light emitting device being provided alone, and (Va−Vb) represents an amount by which the light emitting device has its forward voltage reduced in accordance with the temperature change of the light emitting device caused by the light emitted therefrom in the single primary scanning time period with the light emitting device being provided alone when the current supplied to the light emitting device is constant.

2. A light emitting device drive circuit for a printing plate producing apparatus which has a light emitting device for emitting a laser beam for scanning a photosensitive material placed in an exposing section along both a primary scanning direction and a secondary scanning direction and exposing an image on a photosensitive material, controls an intensity of light when the light emitting device starts a primary scanning to keep a predetermined value, and drives the light emitting device in accordance with an input signal, the light emitting device drive circuit comprising:

a light receiving device for receiving the laser beam emitted from the light emitting device;

a control section for performing an auto power control based on an intensity of light received by the light receiving device, and for generating the input signal using a blanking area where the light emitting device does not perform the primary scanning, so that the intensity of light when the light emitting device starts the primary scanning is the predetermined value;

a current source for generating constant currents, each being supplied to the light emitting device either in a light emitting state or an extinction state in accordance with the input signal;

the light emitting device to which a current is supplied by the current source;

a coil connected at one end to an anode of the light emitting device; and a resistor connected between the other end of the coil and a cathode of the light emitting device, wherein the light emitting device emits light and quenches light emission in accordance with a drive current which is a subtraction of a current supplied to the coil and the resistor from the current supplied by the current source, and the resistance value R of the resistor is obtained using an equation:

$R=(Va-Vb)/(ib-i)$ where (ib−i) represents an amount of change of current supplied to the light emitting device, wherein the amount of change of current supplied to the light emitting device is required for keeping the intensity of light output by the light emitting device constant with a temperature change of the light emitting device caused by a light emitted therefrom in a single primary scanning time period with the light emitting device being provided alone, and (Va−Vb) represents an amount by which the light emitting device has its forward voltage reduced in accordance with the temperature change of the light emitting device caused by the light emitted therefrom in the single primary scanning time period with the light emitting device being provided alone when the current supplied to the light emitting device is constant.

3. The light emitting device drive circuit according to claim 2, wherein values of the coil and the resistor are such that the drive current supplied to the light emitting device during a rising response delay period in a transition from an extinction state of the light emitting device to a light emitting state, is greater than a drive current supplied after the rising response delay period has passed.

4. A light emitting device drive circuit for a printing plate producing apparatus which has a light emitting device for emitting a laser beam for scanning a photosensitive material placed in an exposing section along both a primary scanning direction and a secondary scanning direction and exposing an image on a photosensitive material, controls an intensity of light when the light emitting device starts a primary scanning to keep a predetermined value, and drives the light emitting device in accordance with an input signal, the light emitting device drive circuit comprising:

a light receiving device for receiving the laser beam emitted from the light emitting device;

a control section for performing an auto power control based on an intensity of light received by the light receiving device, and for generating the input signal using a blanking area where the light emitting device does not perform the primary scanning, so that the intensity of light when the light emitting device starts the primary scanning is the predetermined value;

a current source for generating constant currents, each being supplied to the light emitting device either in a light emitting state or an extinction state in accordance with the input signal;

the light emitting device to which a current is supplied by the current source;

a resistor connected at one end to an anode of the light emitting device; and a coil connected between the other end of the resistor and a cathode of the light emitting device, wherein the light emitting device emits light and quenches light emission in accordance with a drive current which is a subtraction of a current supplied to the resistor and the coil from the current supplied by the current source, and the resistance value R of the resistor is obtained using an equation:

$R=(Va-Vb)/(ib-i)$ where (ib−i) represents an amount of change of current supplied to the light emitting device, wherein the amount of change of current supplied to the light emitting device is required for keeping the intensity of light output by the light emitting device constant with a temperature change of the light emitting device caused by a light emitted therefrom in a single primary scanning time period with the light emitting device being provided alone, and (Va−Vb) represents an amount by which the light emitting device has its forward voltage reduced in accordance with the temperature change of the light emitting device caused by the light emitted therefrom in the single primary scanning time period with the light emitting device being provided alone when the current supplied to the light emitting device is constant.

5. The light emitting device drive circuit according to claim 4, wherein values of the coil and the resistor are such that the drive current supplied to the light emitting device during a rising response delay period in a transition from an extinction state of the light emitting device to a light emitting state is greater than a drive current supplied after the rising response delay period has passed.

* * * * *